(12) United States Patent
Kuroiwa et al.

(10) Patent No.: US 6,187,622 B1
(45) Date of Patent: *Feb. 13, 2001

(54) SEMICONDUCTOR MEMORY DEVICE AND METHOD FOR PRODUCING THE SAME

(75) Inventors: Takeharu Kuroiwa; Tsuyoshi Horikawa; Noboru Mikami; Tetsuro Makita, all of Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/003,515

(22) Filed: Jan. 6, 1998

(30) Foreign Application Priority Data

Jan. 14, 1997 (JP) .................................................. 9-004698
Oct. 20, 1997 (JP) .................................................. 9-287062

(51) Int. Cl.$^7$ ............................................... H01L 21/8242
(52) U.S. Cl. ......................... 438/240; 438/253; 438/680
(58) Field of Search ........................... 257/68, 303, 307, 257/306, 310; 438/240, 253, 396, 680, 681, 785

(56) References Cited

U.S. PATENT DOCUMENTS

| | | | |
|---|---|---|---|
| 5,335,138 | * | 8/1994 | Sandhu et al. ..................... 361/303 |
| 5,336,922 | * | 8/1994 | Sakamoto ........................... 257/534 |
| 5,459,345 | * | 10/1995 | Okudaira et al. ................... 257/310 |
| 5,519,237 | * | 5/1996 | Itoh et al. .......................... 257/306 |
| 5,726,083 | * | 3/1998 | Takaishi ............................. 438/210 |
| 5,748,521 | * | 5/1998 | Lee .................................... 365/149 |
| 5,793,076 | * | 8/1998 | Fazan et al. ....................... 257/298 |
| 5,852,307 | * | 12/1998 | Aoyama et al. ................... 257/295 |
| 5,883,781 | * | 4/1999 | Yamamichi et al. ........... 361/321.4 |
| 5,932,906 | * | 8/1999 | Shimizu ............................. 257/306 |
| 5,939,748 | * | 8/1999 | Takaishi ............................. 257/310 |
| 6,093,615 | * | 7/2000 | Schuele et al. ................... 438/798 |

FOREIGN PATENT DOCUMENTS

| | | | |
|---|---|---|---|
| 3-87055 | 4/1991 | (JP) | ........................................... 27/4 |
| 3-257858 | 11/1991 | (JP) | ........................................... 27/4 |
| 7-142598 | 6/1995 | (JP) | . |

* cited by examiner

Primary Examiner—Chandra Chaudhari

(57) ABSTRACT

A semiconductor memory device achieves a high capacitance value even when the elements are made extremely small as the degree of integration is increased. A method of producing such a semiconductor memory maintains a high capacitance value while achieving increased integration. A semiconductor memory device includes adjacent capacitor lower electrodes which are separated by a width of 0.2 $\mu$m while the ratio of the capacitor lower electrode height to the separation width is 1, the capacitor upper electrode covers the capacitor insulation film, and steps generated in the separated portion of the capacitor lower electrodes are filled by the upper electrode material. A method of manufacturing produces a semiconductor memory device wherein the capacitor upper electrode is formed in plasma which includes etchable gas by chemical or physical action.

16 Claims, 12 Drawing Sheets

SEMICONDUCTOR MEMORY DEVICE AND METHOD FOR PRODUCING THE SAME

BACKGROUND OF THE INVENTION

1. Field of the Invention

The present invention relates to a semiconductor memory device, and a method for producing the same. More particularly, the present invention relates to the construction of a DRAM (Dynamic Random Access Memory) employing a material having a high dielectric constant for the capacitor insulation film, and a method for producing the same.

2. Description of Prior Art

The DRAM has been widely used as a semiconductor memory device which is capable of random input and output of stored information. A DRAM generally has a memory cell array which is a storage area for storing much information and a peripheral circuit required for external input/output.

The memory cell array which occupies a large area on a semiconductor chip comprises a plurality of memory cells, each storing unit information, arranged in a matrix. One memory cell generally comprises one MOS (Metal Oxide Semiconductor) transistor and a capacitor connected thereto. A memory cell of this type is called 1-transistor, 1-capacitor memory cell. Because of simple construction, a memory cell of this type allows an increased degree of integration of the memory cell array. Thus it has been widely used for DRAMs of large storing capacities.

Memory cells of DRAM can be classified into several types based on the capacitor construction used. Among these is one called a stacked capacitor. The stacked capacitor increases the area of electrodes opposing each other by extending a key portion of the capacitor onto a gate electrode or a field oxide film.

The stacked capacitor having such a feature as described above can secure a capacitance even when the element is made extremely small due to the integration of semiconductor memory device. As a result, stacked capacitors have come to be used widely as semiconductor memory devices become highly integrated.

However, in such applications that require even smaller elements as in 256 M bit DRAM, for example, it becomes difficult to provide the required value of capacitance even with the stacked capacitor.

Thus attempts to increase the capacitance have been made by using a dielectric film made of a material having high dielectric constant such as PZT (lead titanate zirconate) as the capacitor insulation film. For example, FIG. 8 of Japanese Patent Kokai Publication No. 7-142598 shows an example of DRAM employing a material having high dielectric constant such as PZT as the capacitor insulation film. FIG. 1 of the publication shows a capacitor lower electrode having a separation width (slot width) of 0.2 $\mu$m and height of 150 nm.

According to this example, a capacitor insulation film of a high dielectric constant is formed by a known method of deposition on the capacitor lower electrode processed with a separation width of 0.2 $\mu$m or less, then an upper electrode is formed by MOCVD process.

However, methods of the prior art have such problems as described below. That is, in the prior art, attempts have been made to make lower electrodes called the stacked capacitor in a 3-dimensional configuration in order to store a required amount of electric charge in a capacitor which is electrically connected to a principal plane of a semiconductor substrate via an aperture of an inter-layer insulation film. While this results in a separation width between adjacent lower electrodes as small as 0.2 $\mu$m or less and the area of the lower electrode itself projected onto a principle plane as small as 0.15 square micrometers or less, thus requiring it to secure a required facing area of the electrodes by increasing the height of the lower electrode thereby storing the required amount of electric charge in the capacitor, in a DRAM having a storage capacity of 1 G bit, for example. During the producing process, however, adjacent lower electrodes are separated by a very narrow and deep slot and therefore the upper electrode of the capacitor to be provided on the lower electrode must be formed over a step which is even more narrow and deep in correspondence to the thickness of the insulation film, even when the capacitor insulation film can be formed uniformly over the lower electrodes of such a configuration. Thus the capacitor insulation film cannot be fully covered by the upper electrode in simple MOCVD process or sputtering method, resulting in such a problem as a portion where the upper electrode is not formed remains. Hence there has been a limitation on the effort of providing a required value of capacitance while maintaining the reliability of the device.

SUMMARY OF THE INVENTION

The present invention has been made to solve the problems described above. An object of the present invention is to provide a semiconductor memory device which is capable of securing a specified value of capacitance even when the elements are made extremely small for higher degree of integration. Another object of the present invention is to provide a method of producing the semiconductor memory device which secures a specified value of capacitance while maintaining the reliability of the device.

A semiconductor memory device according to first configuration of the present invention is provided with a semiconductor substrate which has a principal plane, an inter-layer insulation film which is formed on the principal plane of the semiconductor substrate and has such an aperture that reaches the principal plane of the semiconductor substrate, a connecting member embedded in the aperture, a plurality of capacitor lower electrodes arranged side by side while being separated by slots and electrically connected to the principal plane of the semiconductor substrate via the connecting member, a capacitor insulation film formed from a material having a high dielectric constant to cover the lower electrodes while leaving a portion of the slot as a step, and a capacitor upper electrode formed on the capacitor insulation film, wherein the adjacent capacitor lower electrodes are separated by a space of 0.2 $\mu$m or less, ratio of the height of the lower electrode to the separation width being 1 or higher, and the capacitor upper electrode is formed to cover the capacitor insulation film and fill the step.

According to the first configuration of the present invention, such a problem as a failure of forming the capacitor upper electrode in the step portion leading to lower reliability of the device can be eliminated, and the specified value of capacitance can be obtained even when the elements are made extremely small due to high degree of integration.

A semiconductor memory device according to second configuration of the present invention is provided with a semiconductor substrate which has a principal plane, an inter-layer insulation film which is formed on the principal plane of the semiconductor substrate and has such an aperture that reaches the principal plane of the semiconductor substrate, a connecting member embedded in the aperture, a plurality of capacitor lower electrodes arranged side by side while being separated by slots and electrically connected to the principal plane of the semiconductor substrate via the connecting member, a capacitor insulation film formed from a material having a high dielectric constant to cover the capacitor lower electrode while leaving a portion of the slot as a step, and a capacitor upper electrode formed in plasma which includes etchable gas to cover the capacitor insulation film and fill the step.

According to the second configuration of the present invention, even a very narrow and deep step can be effectively filled, and such a problem as a failure of forming the capacitor upper electrode in the step portion leading to lower reliability of the device can be eliminated, while the specified value of capacitance can be obtained even when the elements are made extremely small due to high degree of integration.

A semiconductor memory device according to third configuration of the present invention is, in addition to the second configuration, separation width of the adjacent capacitor lower electrodes is 0.2 μm or less, and the ratio of the height of the lower electrode to the separation width is 1 or higher thus allowing for further higher degree of integration.

According to the third configuration of the present invention, because the separation width of the adjacent capacitor lower electrodes is 0.2 μm or less and the ratio of the separation width to the height of the lower electrode is 1 or higher, in addition to the second configuration, further higher degree of integration is made possible.

A semiconductor memory device according to fourth configuration of the present invention is one of the first through the third configurations where the capacitor lower electrode has an area projected onto a principle plane in a range from $1.5 \times 10^{-1}$ μm$^2$ to $9.8 \times 10^{-3}$ μm$^2$.

According to the fourth configuration of the present invention, because the area of the lower electrode of the capacitor projected onto a principle plane is $1.5 \times 10^{-1}$ μm$^2$ to $9.8 \times 10^{-3}$ μm$^2$, further higher degree of integration is made possible.

A semiconductor memory device according to fifth configuration of the present invention is one of the first through the fourth configurations where the capacitor upper electrode has a triangular shape protruding from the separating portion toward the middle portion.

According to the fifth configuration of the present invention, because the upper electrode has a triangular shape protruding from the separating portion toward the middle portion, a very narrow and deep step can be surely filled and higher degree of integration is made possible.

A semiconductor memory device according to sixth configuration of the present invention is one of the first through the fourth configurations where the capacitor upper electrode has a flat surface after the flatting treatment of the triangular shaped capacitor upper electrode.

According to the sixth configuration of the present invention, because the upper electrode has a flat surface, steps following the step of forming the capacitor upper electrode is made easy and it is made possible to improve the yield and the reliability of the device.

A semiconductor memory device according to seventh configuration of the present invention is one of the first through the third configurations where the capacitor lower electrode is made in a curved configuration having a radius of curvature in a range from 0.05 to 0.8 μm.

According to the seventh configuration of the present invention, because the capacitor lower electrode is made in a curved configuration having a radius of curvature in a range from 0.05 to 0.8 μm, filling characteristic of the upper electrode in the separation portions can be improved and electric characteristics such as mitigation of the concentration of electric field can be improved.

A semiconductor memory device according to eighth configuration of the present invention is one of the first through the third configurations where the capacitor upper electrode has a layer formed from a metal including at least one element of ruthenium, iridium, platinum, palladium, rhodium and rhenium, or a compound thereof.

According to the eighth configuration of the present invention, because the capacitor upper electrode has a layer formed from a metal including at least one element of ruthenium, iridium, platinum, palladium, rhodium and rhenium or a compound thereof, required value of capacitance can be obtained without deteriorating the insulation characteristic of the capacitor insulation film.

A semiconductor memory device according to ninth configuration of the present invention is one of the first through the third configurations where the capacitor upper electrode has a layer formed from a metal including 1 to 0.01% of oxygen and at least one element of ruthenium, iridium, platinum, palladium, rhodium and rhenium.

According to the ninth configuration of the present invention, because the capacitor upper electrode has a layer formed from a metal including 1 to 0.01% of oxygen and at least one element of ruthenium, iridium, platinum, palladium, rhodium and rhenium, an effect of mitigating the film stress of the upper electrode is obtained in addition to the effect achieved by the eighth configuration.

A semiconductor memory device according to tenth configuration of the present invention is one of the first through the third configurations where the capacitor upper electrode has a contact layer or a conductive diffusion-prevention layer formed on at least a part thereof.

According to the tenth configuration of the present invention, because the contact layer or the conductive diffusion-prevention layer is formed on at least a part of the capacitor upper electrode, close contact with a film to be formed in a subsequent step can be ensured and chemical stability can be achieved during subsequent step.

A semiconductor memory device according to eleventh configuration of the present invention is one of the first through the third configurations where a conductive diffusion-prevention layer is formed between the connecting member and the capacitor lower electrode.

According to the eleventh configuration of the present invention, because the conductive diffusion-prevention layer is formed between the connecting member and the capacitor lower electrode, diffusion of the connecting member into the capacitor lower electrode can be prevented.

A semiconductor memory device according to twelfth configuration of the present invention is provided with a semiconductor substrate which has a principal plane, an inter-layer insulation film which is formed on the principal plane of the semiconductor substrate and has such an aperture that reaches the principal plane of the semiconductor substrate, a connecting member embedded in the aperture, capacitor lower electrode electrically connected to the principal plane of the semiconductor substrate via the connecting member, a capacitor insulation film made from a material having a high dielectric constant and formed on the capacitor lower electrode, and a capacitor upper electrode formed on the capacitor insulation film, wherein the adjacent lower electrodes are separated by a space of 0.2 μm or less, ratio of the height of the lower electrode to the separation width is 1 or higher, and the capacitor upper electrode is formed to cover the capacitor insulation film and fill the step which is made in the separating portion of the capacitor lower electrodes.

According to the twelfth configuration of the present invention, such a problem as a partial failure of forming the upper electrode in the step portion leading to lower reliability of the device can be eliminated, and specified value of capacitance can be obtained even when the elements are made extremely small due to high degree of integration.

A semiconductor memory device according to thirteenth configuration of the present invention has capacitor upper electrode of which at least one layer comprises a metal including at least one element of ruthenium, iridium, platinum, palladium, rhodium and rhenium, or a compound thereof.

According to the thirteenth configuration of the present invention, because at least one layer of the capacitor upper electrode comprises a metal including at least one element of ruthenium, iridium, platinum, palladium, rhodium and rhenium, or a compound thereof, required value of capacitance can be ensured without compromising the insulation characteristic of the capacitor insulation film.

A semiconductor memory device according to fourteenth configuration of the present invention has capacitor upper electrode which fills the step made in the separating portion of the capacitor lower electrodes and has a flat surface.

According to the fourteenth configuration of the present invention, because the capacitor upper electrode fills the step made in the separating portion of the lower electrodes and has flat surface, steps following the formation of the upper electrode can be simplified while yield and device reliability can be improved.

A first method for producing the semiconductor memory device according to the present invention comprises a step of forming such an inter-layer insulation film, on the principal plane of the semiconductor substrate, that has an aperture which reaches the principal plane of a semiconductor substrate, a step of embedding a connecting member in the aperture, a step of forming a plurality of capacitor lower electrodes arranged side by side while being separated by slots and electrically connected to the principal plane of the semiconductor substrate via the connecting member, a step of forming a capacitor insulation film formed from a material having a high dielectric constant to cover the lower electrode while leaving a portion of the slot in the form of a step, and a step of forming a capacitor upper electrode on the capacitor insulator film, wherein the upper electrode is formed in plasma which includes etchable gas, thereby to cover the capacitor insulation film and fill the step.

According to the first method of the present invention, because even a very narrow and deep step can be effectively filled, semiconductor memory devices having specified value of capacitance can be easily manufactured while securing the reliability of the device even when the elements are made extremely small due to high degree of integration.

A second method for producing the semiconductor memory device according to the present invention is the first method wherein the capacitor upper electrode is formed by sputtering process while using argon gas with oxygen gas added thereto.

According to the second method of the present invention, because the capacitor upper electrode is formed by the sputtering process which uses argon gas with oxygen gas added thereto, chemical etching mechanism of forming a volatile oxide due to the action of oxygen plasma and sputter etching mechanism by argon ions proceed concurrently, thereby making it possible to effectively fill even a very narrow and deep step.

A third method for producing the semiconductor memory device according to the present invention is the second method wherein oxide of a metal including at least one element of ruthenium, iridium, platinum, palladium, rhodium and rhenium is used as the sputtering target.

According to the third method of the present invention, because oxide of a metal including at least one element of ruthenium, iridium, platinum, palladium, rhodium and rhenium is used as the sputtering target, such a problem as the film quality becomes unstable at the early stage of film formation due to the oxidization of the target is eliminated.

A fourth method for producing the semiconductor memory device according to the present invention is the first method wherein the capacitor upper electrode is formed by plasma CVD process in an oxidizing gas atmosphere with argon gas added, or in a reducing gas atmosphere with argon gas added thereto.

According to the fourth method of the present invention, because the capacitor upper electrode is formed by the plasma CVD process in an oxidizing gas atmosphere with argon gas added, or in a reducing gas atmosphere with argon gas added thereto, sputter etching mechanism by argon ions proceeds concurrently with the film formation, and it is made possible to fill even a very narrow and deep step.

A fifth method for producing the semiconductor memory device according to the present invention is one of the first through the fourth methods wherein the capacitor upper electrode is formed by sputtering process or the plasma CVD process using a gas with halogen gas added.

According to the fifth method of the present invention, because the capacitor upper electrode is formed by the sputtering process or the plasma CVD process using a gas with halogen gas added thereto, the halogen gas assists the generation of a volatile oxide and suppresses the decomposition thereof, thus making it possible to fill even a narrower and deeper step.

A sixth method for producing the semiconductor memory device according to the present invention is a method for producing the semiconductor memory device which is provided with a semiconductor substrate having a principal plane, an inter-layer insulation film which is formed on the principal plane of the semiconductor substrate and has an aperture that reaches the principal plane of the semiconductor substrate, a connecting member embedded in the aperture, capacitor lower electrodes which are electrically connected to the principal plane of the semiconductor substrate via the connecting member, a capacitor insulation film formed from a material having a high dielectric constant on the lower electrode and a capacitor upper electrode formed on the capacitor insulator film, wherein the capacitor upper electrode is formed by chemical or physical action in plasma which includes etchable gas.

According to the sixth method of the present invention, because even a very narrow and deep step can be effectively filled while the formation and flattening of the capacitor upper electrode can be let proceed concurrently, semiconductor memory devices having specified value of capacitance can be easily manufactured while securing the reliability of the device, even when the elements are made extremely small due to higher degree of integration.

A seventh method for producing the semiconductor memory device according to the present invention uses a metal including at least one element of ruthenium, iridium, platinum, palladium, rhodium and rhenium, or a compound thereof to make at least one layer of the capacitor upper electrode.

According to the seventh method of the present invention, because a metal including at least one element of ruthenium, iridium, platinum, palladium, rhodium and rhenium, or a compound thereof is used to make at least one layer of the capacitor upper electrode, required value of capacitance can be obtained without compromising the insulation characteristic of the capacitor insulation film.

PREFERRED EMBODIMENTS OF THE PRESENT INVENTION

Embodiment 1

A first embodiment of the present invention will be described below with reference to FIG. 1 through FIG. 7. FIG. 1 through FIG. 7 are partial sectional views sequentially showing the method for production of DRAM in the first embodiment of the present invention.

Figure 1:
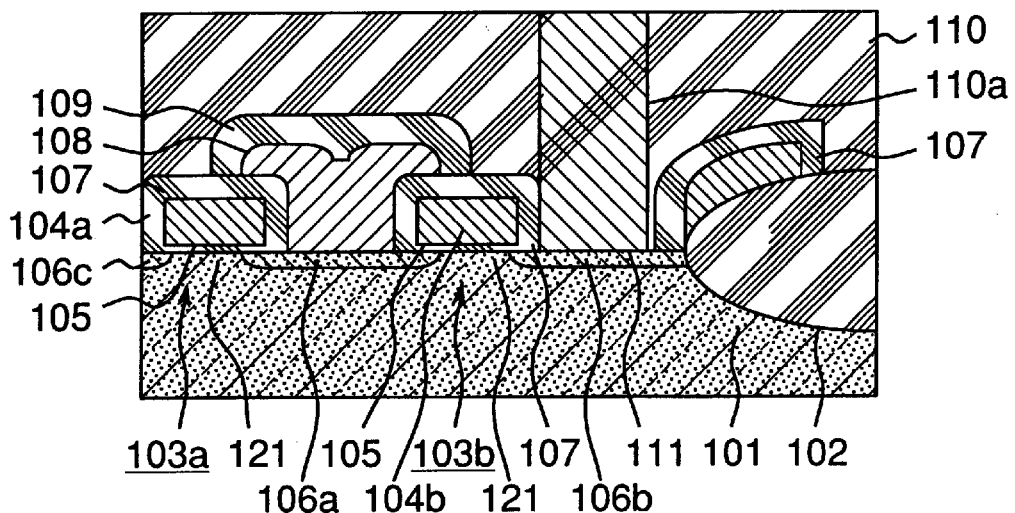
FIG. 1 is a cross sectional view explaining the first step of the method for production of DRAM according to one embodiment of the present invention.

In the first step shown in FIG. 1, lower structure of a capacitor comprising a P type semiconductor substrate 101, a field oxide film 102, transfer gate transistors 103a, 103b, N type impurity regions 106a, 106b, 106c, a channel region 121, a gate insulation film 105, gate electrodes 104a, 104b, an oxide film 107, an embedded bit line 108, an insulation layer 109, a first inter-layer insulation film 110, a contact hole 110a, etc. is formed in methods similar to the prior art.

Then the contact hole 110a is filled by CVD process employing $SiH_4$ gas and a polycrystalline silicon layer which is formed to cover the first inter-layer insulation film 110 and is doped with phosphorus is etched back by RIE process or the like, thereby to form a plug 111 in the contact hole 110a. Although silicon is used as the material to make the plug 111 in this embodiment, metals such as tungsten, titanium and tantalum or alloys or nitride of these metals can also be used.

Figure 2:
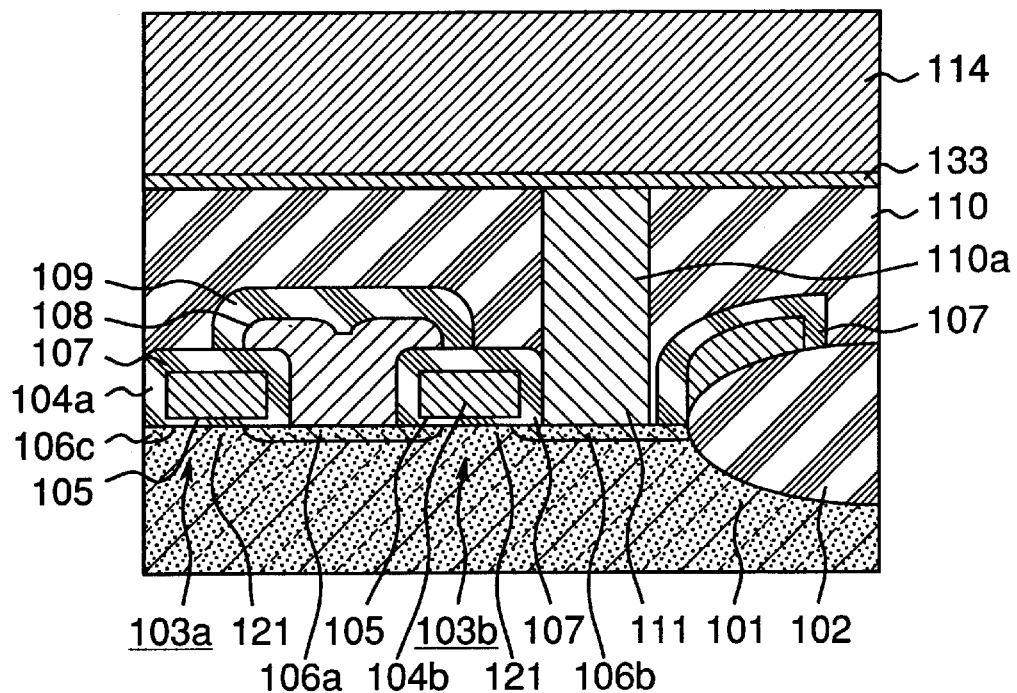
FIG. 2 is a cross sectional view explaining the second step of the method for production of DRAM according to one embodiment of the present invention.
Figure 8:
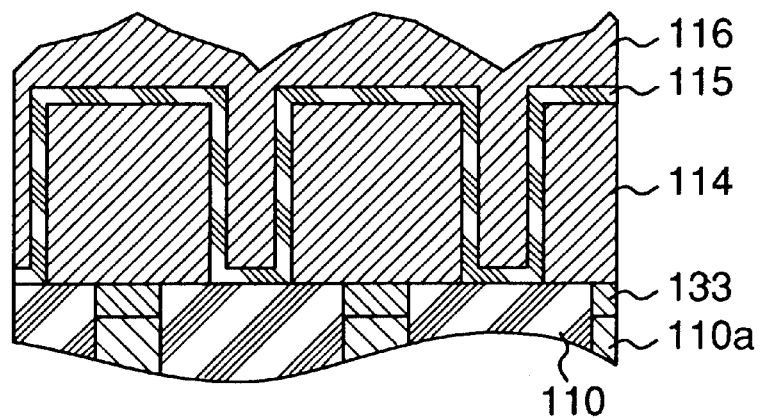
FIG. 8 is a cross sectional view showing another key portion of DRAM according to one embodiment of the present invention.

In the second step shown in FIG. 2, a capacitor lower electrode 114 is deposited on top face of the plug 111 and on the surface of the first inter-layer insulation film 110. In this embodiment, because polycrystalline silicon doped with phosphorus is used to make the plug 111, a conductive diffusion-prevention layer 133 made from titanium (contact metal) and nitride thereof (conductive metal nitride) is formed between the capacitor lower electrode 114 and the plug 111 for the purpose of preventing the diffusion of silicon into the lower electrode 114. When diffusion does not make a problem, however, formation of the conductive diffusion-prevention layer 133 may be omitted in such a case as titanium nitride, for example, is chosen as the material to make the plug 111. The contact metal may be titanium, cobalt, nickel or the like, and these materials have low electric resistances even when reacted with silicon to turn into silicide, posing no problems. It has also be verified that contact resistance can be decreased by letting part of the conductive diffusion-prevention layer 133 react with the plug 111. It is also effective to use the plug 111 itself or a part of the plug 111, as shown in FIG. 8, as the conductive diffusion-prevention layer 133 comprising a conductive metal nitride and a contact metal.

The lower electrode 114 may be deposited by the CVD process or the sputtering process, by using such a metal as ruthenium, iridium, platinum, palladium, rhodium or rhenium, or a compound thereof as the material.

According to this embodiment, a metal ruthenium film having a thickness of 400 nm was formed as the lower electrode 114 by heating the semiconductor substrate 101 to 400° C. in the sputtering process.

While the semiconductor substrate may not necessarily be heated, in case it is heated, the temperature is preferably within 850° C.

Thickness of the lower electrode 114 is preferably such as the effect of making a practical increase in the capacitance is recognized, and within a range from 200 nm to 800 nm in consideration of the machining accuracy.

Figure 3:
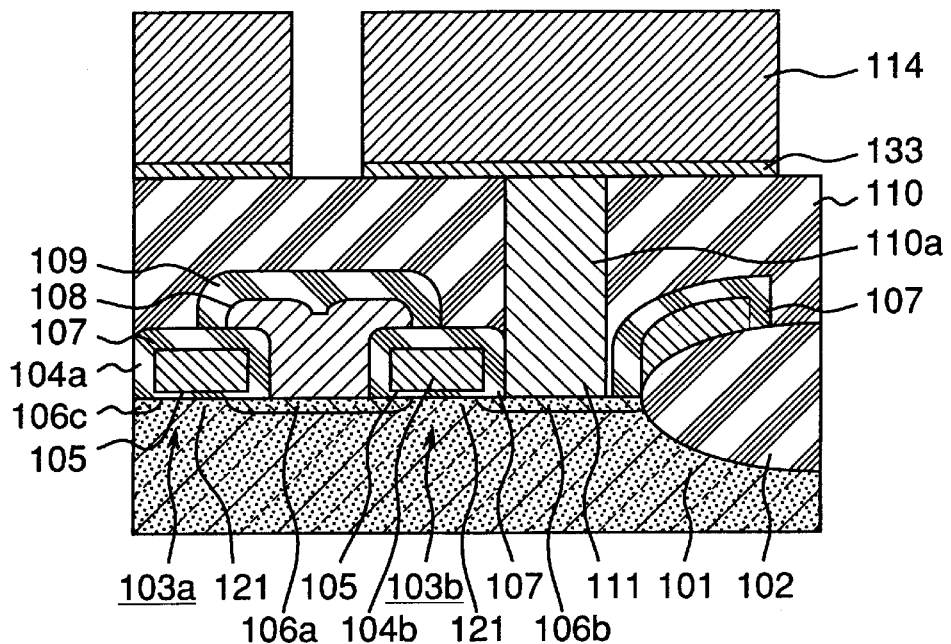
FIG. 3 is a cross sectional view explaining the third step of the method for production of DRAM according to one embodiment of the present invention.

In the third step shown in FIG. 3, a slot is made by reactive ion etching to separate adjacent capacitor lower electrodes 114 by a space of 0.2 $\mu$m. As the height of the lower electrode 114 is 400 nm, the ratio of height to separation width is 2. Size of the capacitor lower electrode 114 is determined so that the projected area onto horizontal plane is from 0.25 $\mu$m×0.60 $\mu$m (maximum area 0.15 $\mu$m$^2$) to 0.07 $\mu$m×0.14 $\mu$m (minimum area 0.0098 $\mu$m$^2$). While separation width is set to 0.2 $\mu$m in this embodiment, it can be selected from a range of 0.2 $\mu$m to 0.05 $\mu$m.

Figure 4:
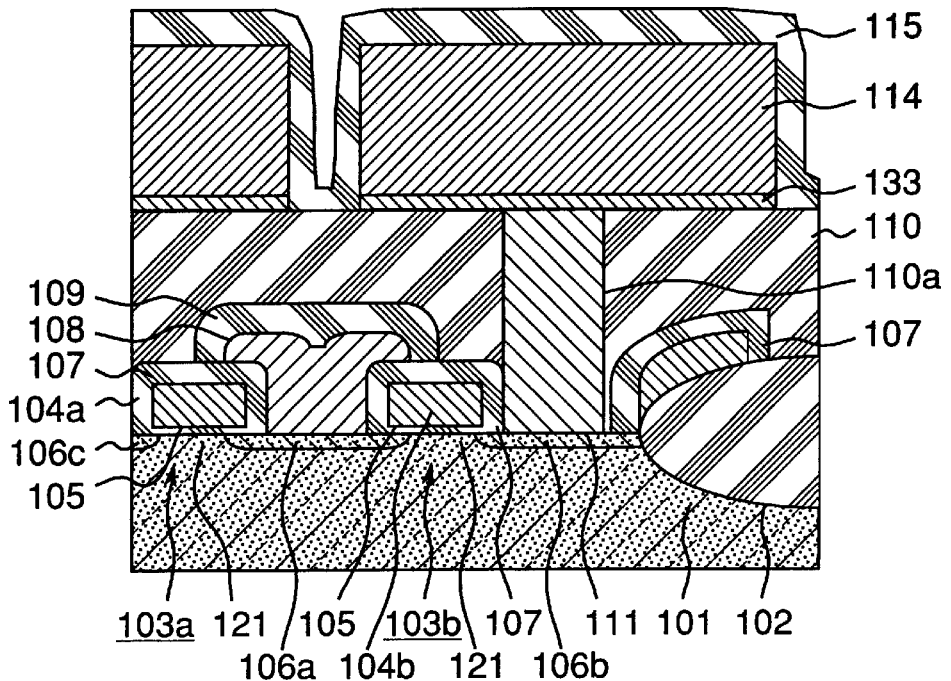
FIG. 4 is a cross sectional view explaining the fourth step of the method for production of DRAM according to one embodiment of the present invention.

In the fourth step shown in FIG. 4, $SrTiO_3$ film is deposited to form the capacitor insulation film 115 which has perovskite type crystal structure. In this embodiment, the CVD process is employed in forming the capacitor insulation film 115 in consideration of coverage of the side face of the lower electrode. Thickness of the film is 50 nm in this embodiment. Although the capacitor insulation film 115 covers the capacitor lower electrode 114 and is formed also in the slot of the separating portion, part of the slot remains as a step because the separation width is 0.2 $\mu$m and thickness of the capacitor insulation film 115 is 50 nm.

The step after forming the capacitor insulation film 115 becomes very narrow and deep, 0.1 $\mu$m in width and 0.4 $\mu$m in height thus having an aspect ratio of 4.

Figure 5:
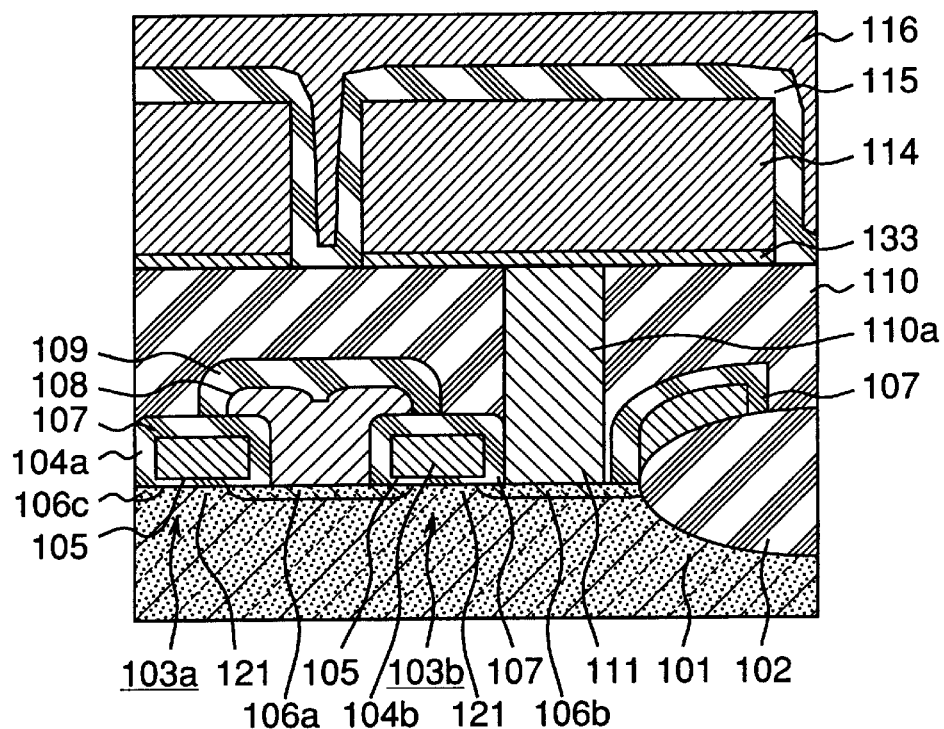
FIG. 5 is a cross sectional view explaining the fifth step of the method for production of DRAM according to one embodiment of the present invention.

In the fifth step shown in FIG. 5, the capacitor upper electrode 116 is formed to cover the capacitor insulation film 115 and fill the step.

The capacitor upper electrode 116 is made of such a metal as ruthenium, iridium, platinum, palladium, rhodium or rhenium, or a compound thereof. First a case of forming a metal ruthenium film by the sputtering process as the capacitor upper electrode 116 will be described below. Major sputtering conditions are as follows (these conditions will be called the standard conditions hereafter).

Substrate temperature: 400° C.
Introduced gas: Argon, oxygen
Proportion of gases: Argon: Oxygen=9:1
RF power: 1.25 W/cm$^2$
Vacuum before film formation: Within 1×10$^{-5}$ Torr
Gas pressure: 3 mTorr
Target: Metal ruthenium
Film forming speed: 15 nm/minute Because the film is formed in an atmosphere of a pressure from 0.5 to 5 mTorr by using a gas comprising argon gas, which is typically used in the sputtering of single metals, and oxygen added in the proportion of 0.1 to 20% in flow rate (oxygen content in the film is 1 to 0.01%), chemical etching mechanism of forming a volatile oxide due to the action of oxygen plasma and sputter etching mechanism by argon ions proceed concurrently. By controlling the degree of vacuum before film formation at 1×10$^{-5}$ Torr, unevenness in the oxygen content caused by residual oxygen which leads to poor reproducibility can be prevented. As the volatile oxide can easily decompose and deposit on the substrate again, a film of good step coverage can be made in a mechanism similar to the CVD process notwithstanding of the sputtering process, thus making it possible to fill a very narrow slot.

Figure 9A:
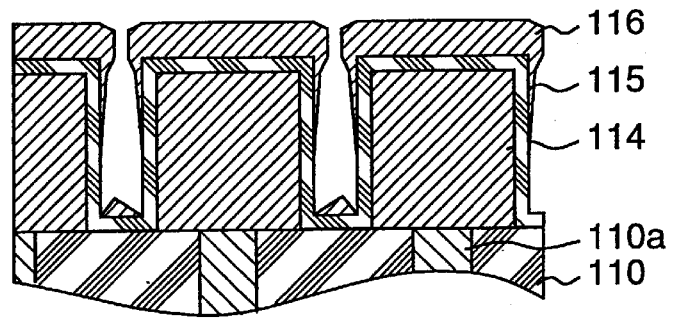
FIGS. 9A–9C illustrate the process of forming the upper electrode in relation to one embodiment of the present invention.
Figure 9B:
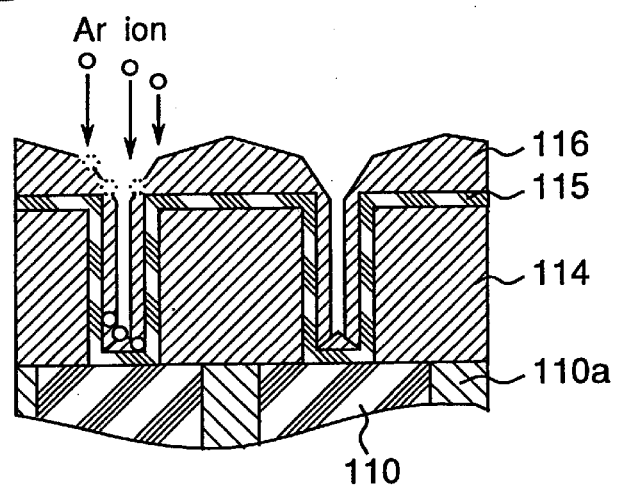
Figure 9C:
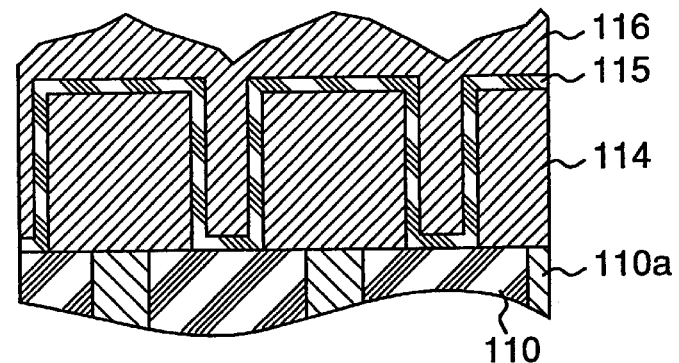

The method of forming the upper electrode 116 will be described with reference to FIG. 9A through FIG. 9C. Because of the directivity of sputtered particles in normal sputtering film formation, it is difficult to form a film over a very narrow slot with high coverage as shown in FIG. 9A. However, because argon gas causes the so-called reverse sputtering effect as the mean free path becomes longer in the case of sputtering at a low pressure, film at a corner which is formed near the microscopic slot is sputter-etched in preference, while a part thereof deposits again in the direction of the bottom of the microscopic slot, and the formation of an overhang on the microscopic slot is prevented. Further, configuration shown in FIG. 9B is obtained by adding the effect of film formation by ruthenium tetraoxide vapor generated in the sputtering of ruthenium with the addition of oxygen. When the sputtering is continued in similar environment, final configuration shown in FIG. 9C is obtained.

Proportion of oxygen flow rate is controlled by means of the rate of film formation, while the oxygen flow rate must be decreased when the rate of film formation is slow and the oxygen flow rate must be increased when the rate of film formation is high (0.1% suffices at about 10 nm/minute but about 20% is required at 400 nm/minute). Etching/film formation ratio can be controlled to 1:5 to 1:3 by controlling the proportion of oxygen flow rate as described above.

In case decomposition of volatile oxide takes place only near the aperture, not near the bottom of the microscopic slot, namely when the slot is very narrow and deep (0.4 to 0.8 $\mu$m in depth and 0.05 to 0.15 $\mu$m in width), filling by the generation of the volatile oxide may not occur effectively. In this case, modifying the etching/film formation ratio to increase the etching rate from 1:5–1:3 described above to 1:3–1:2 (increase the oxygen gas added) or adding 10% or less of halogen gas such as chloride to the gas phase will solve the problem. Added halogen gas assists the formation of a volatile oxide and suppresses the decomposition thereof.

Now a method of forming a ruthenium dioxide film, which is a compound of ruthenium, as the upper electrode 116 by the sputtering process will be described below. Major sputtering conditions are as follows.

Substrate temperature: 200° C.
Introduced gas: Argon, oxygen
Proportion of gases: Argon: Oxygen=5:5
RF power: 2.5 W/cm$^2$
Vacuum before film formation: Within 1×10$^{-5}$ Torr
Gas pressure: 3 mTorr
Target: Metal ruthenium
Film forming speed: 20 nm/minute In this embodiment, ruthenium dioxide is deposited by the reactive sputtering process wherein metal ruthenium is used as the target and argon and oxygen are used as major components of the sputtering gas. Sputtering conditions for forming the upper electrode 116 in this embodiment are gas pressure of 0.5 mTorr to 5 mTorr and ratio of film forming rate to etching rate in a range from 2:1 to 5:1.

Oxygen has an effect of accelerating the generation of volatile ruthenium tetraoxide in plasma, and turns a part of ruthenium dioxide film which has been formed into ruthenium tetraoxide, thereby performing chemical etching effect. Because ruthenium tetraoxide which has been generated can easily decompose and deposit again as ruthenium dioxide, part of ruthenium dioxide film which is formed near the step acts to fill the step in the sputtering environment.

It was also clearly recognized that the ruthenium dioxide film which was formed was physically etched by argon, one of the major components of the sputtering gas, and by sputtered ruthenium atoms. In this case, ruthenium dioxide deposited near the step is sputtered again by the effect of sputter-etching, and fills the step (FIG. 9(b)).

The amount of oxygen required during formation of ruthenium dioxide film is 30% when the film forming rate is about 10 nm/minute and about 75% when the film forming rate is about 200 nm/minute, similarly to the case of formation of metal ruthenium film. Increase in the oxygen gas amount and addition of halogen gas for filling a further narrower slot are also similar to the case of metal ruthenium.

In case an oxide of ruthenium or the like, for example, as the material to make the capacitor upper electrode 116 is obtained by sputtering film formation process, similar film can be obtained by using an oxide target, not by the reactive sputtering process which uses an ordinary metal target. This applies also to the capacitor lower electrode 114.

In the reactive sputtering process using an ordinary metal target, the target is cleaned carefully by pre-sputtering because target surface may be oxidized leading to somewhat unstable film quality at the early stage of film formation. Oxide target, on the other hand, does not require such a careful cleaning.

While the film thickness of the capacitor upper electrode 116 differs depending on the space between adjacent elements, the thickness is set to 150 nm as the space (width) is 0.1 $\mu$m in this embodiment.

In such a process where etching and film formation proceed at the same time, etched electrode material deposits again to fill the step, and therefore a very narrow gap 0.1 $\mu$m in width and 0.4 $\mu$m in height, which would be very difficult to fill by the ordinary sputtering film formation process, could be effectively filled.

Filling here refers to the formation of the capacitor upper electrode 116 surface at a position higher than at least the top surface of the capacitor lower electrode 114, and preferably at a position higher than the top surface of the capacitor insulation film 115. In this embodiment, surface of the capacitor upper electrode 116 is located at a position higher than the top surface of the capacitor insulation film 115.

Also according to this embodiment, because ruthenium or oxide thereof is used for the capacitor upper electrode 116, insulation characteristic of the capacitor insulation film 115 does not deteriorate. Insulation characteristic of the capacitor insulation film 115 does not deteriorate provided that a metal including at least one element of ruthenium, iridium, platinum, palladium, rhodium and rhenium, or a compound thereof is used to make at least one layer of the capacitor upper electrode 116.

After forming the upper electrode 116, patterning is performed to obtain the specified configuration.

The plasma CVD process can also be applied for forming the upper electrode 116. In the case of depositing metal ruthenium by the CVD process, for example, deposition can be done at a substrate temperature from 200° C. to 600° C. by using Ru($C_5H_5$)$_2$, Ru(DPM)$_3$, Ru$_3$(CO)$_{12}$ or Ru(hfb)(CO)$_4$ as the material. DPM stands for dipivaloyl methanate, and hfb stands for hexafluoro-2-butyne.

In this embodiment, the upper electrode 116 made of metal ruthenium is formed by using Ru(DPM)$_3$ as the material gas. Film formation was carried out by the plasma CVD process at a substrate temperature of 300° C. by introducing argon gas as a gas component which is capable of physically etching ruthenium, in addition to a material gas and hydrogen gas, which is a reducing gas, as the carrier gas.

As argon gas is added, part of ruthenium film is subject to physical etching by argon ions in the plasma CVD environment. In and around the step, physically etched ruthenium atoms tend to deposit again to fill the step, thus making it possible to fill a very narrow step 0.1 $\mu$m in width and 0.4 $\mu$m in height, compared to the conventional plasma CVD process and thermal CVD process.

Argon gas supply is set so that the ratio of film forming rate to etching rate is in a range from 2:1 to 5:1.

Chemical etching effect of ruthenium is obtained by introducing oxygen gas or oxygen gas and a halogen gas such as chlorine in addition to argon gas, making it possible to effectively fill the step through the generation, decomposition and re-deposition of ruthenium tetraoxide. Further, the ratio of film forming rate to etching rate can be controlled and the finished shape can be changed by adjusting the quantities of oxygen and chlorine gas to be added, providing an effect of making an better flattened shape. This makes the steps following the formation of the capacitor easier, and contributes to the product yield and device reliability. Good effect can be obtained when the flow rate of oxygen gas is set to within 20% that of argon gas, and that of chlorine gas is set to within 25% that of oxygen gas.

In this case, too, a metal such as ruthenium, iridium, platinum, palladium, rhodium or rhenium, or a compound thereof can be used to make the upper electrode 116, and similar process can be applied.

While the standard practice for the plasma CVD is to use hydrogen atmosphere for single metals and oxygen atmosphere for oxide, addition of argon gas to this achieves filling of a step as the product generated by the sputter etching effect is forced into the microscopic slot. Although it is the established idea that the plasma CVD is lower in step coverage performance than the thermal decomposition CVD, as far as the filling performance is concerned, the plasma CVD can be greatly improved by combining the sputter etching effect. In the case of a very narrow and deep slot, as a matter of course, effects of modifying the ratio of etching rate to film forming rate and adding halogen gas are recognized similarly to the case of sputtering film formation.

When filling a further smaller step during formation of the upper electrode 116 in the fifth step, the upper electrode 116 at a portion where the lower electrode 114 is formed may sometimes take a shape resembling a triangle. This shape was observed when SrTiO$_3$ film of a thickness 50 nm was deposited as the capacitor insulation film 115, in case the lower electrode 114 made of ruthenium was processed to become 400 nm in thickness and 0.15 $\mu$m in separation width, that is the ratio of height to separation width of the lower electrode 114 was about 2.6 in this embodiment. At this time, the step which had to be filled with the upper electrode 116 after forming the capacitor insulation film 115 was 0.05 $\mu$m wide and 0.4 $\mu$m high, with aspect ratio of the step being 8. The ratio of film forming rate to etching rate was in a range from 2:1 to 3:1 at this time.

In such an environment where film formation and etching proceed concurrently as described above, the upper electrode 116 after filling the microscopic slot takes a substantially triangular shape which protrudes from the separating portion toward the middle, which is caused by such a physical phenomenon that the corner of the step is preferentially etched out due to the sputter etching effect of argon ions, because film formation by either sputtering or plasma CVD process is carried out in an atmosphere which includes argon ions with a low pressure of 5 mTorr or below. While the shape would become trapezoidal when the capacitor lower electrode 114 is large, for example 1 μm square, it becomes triangular when the capacitor lower electrode 114 is very small as described above. Conversely viewed, when the lower electrode 114 is as tiny as 0.25 μm×0.60 μm and the upper electrode 116 has substantially triangular shape protruding from the separating portion toward the middle, this means that the microscopic slot has been fully filled.

Because satisfactory fill-up has been achieved in elements having large lower electrodes with greater separation width and low steps, the sputter etching phenomenon has been considered to be characterized by a disadvantage of slowing the film forming rate. With tiny elements having small lower electrodes with small separation width and microscopic steps as in the case of this invention, however, effectively filling film could be formed by combining the utilization of the sputter etching phenomenon and such a phenomenon that a metal including at least one element of ruthenium, iridium, platinum, palladium, rhodium and rhenium, or a compound thereof easily generates a volatile oxide in the presence of oxygen plasma.

While the triangular shape can be improved by increasing the proportion of the etching rate to the film forming rate, basically there is no problem because the film covers the capacitor insulation film 116 and fills the step.

While more flat shape may be more desirable than triangular shape in some cases when the ease of the subsequent steps following the formation of the upper electrode 116 and production yield are considered, applying the flattening treatment is effective when the shape poses a problem. In this embodiment, chemical mechanical polishing process was employed for flattening by using a slurry which shows acidity and includes aluminum oxide as a major component. The etch-back process which is commonly used in LSI production methods can also be applied to the flattening treatment. Structure obtained after the flattening treatment is as shown in FIG. 5.

In this case, it is possible to make the steps following the formation of the capacitor upper electrode easier and further improve the yield and device reliability.

Figure 7:
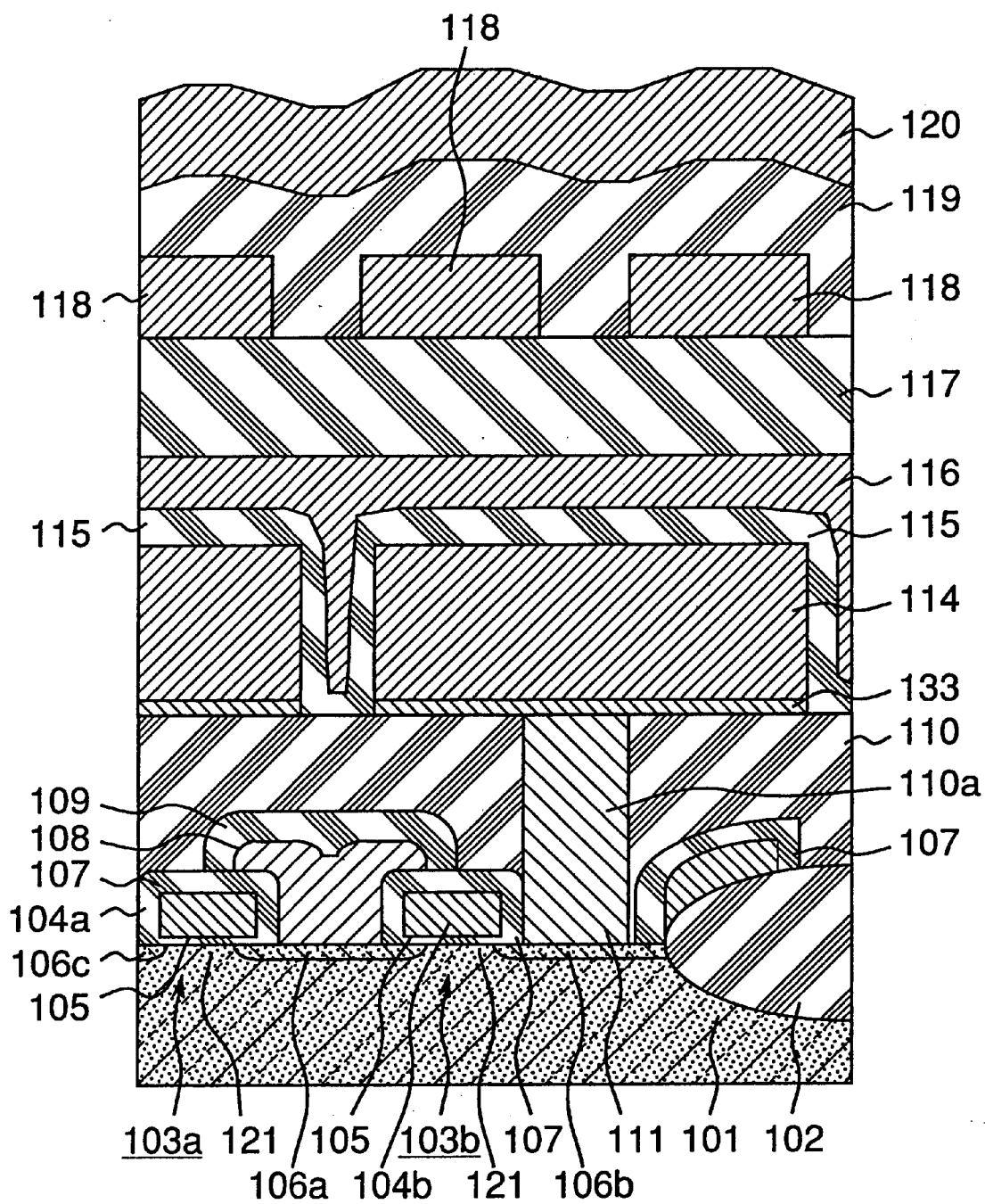
FIG. 7 is a cross sectional view showing a key portion of DRAM according to one embodiment of the present invention.

In the sixth step shown in FIG. 7, a second inter-layer insulation film 117, a first aluminum wiring layer 118, a protective film 119, a second aluminum wiring layer 120, etc. in the upper portion of the capacitor are formed in methods similar to those of the prior art, thereby the DRAM of one embodiment of the present invention can be obtained.

In the device made as shown in FIG. 7, separation width between adjacent lower electrodes 114 is decreased to within 0.2 μm because of the large scale of integration and even when the area of the lower electrode 114 projected onto principal plane is made as small as 0.15 square micrometers or smaller, for example, opposing area of the electrodes can be secured by setting the height of the lower electrodes 114 equal to the separation width or greater, and therefore required amount of electric charge can be stored in the capacitor.

Figure 10:
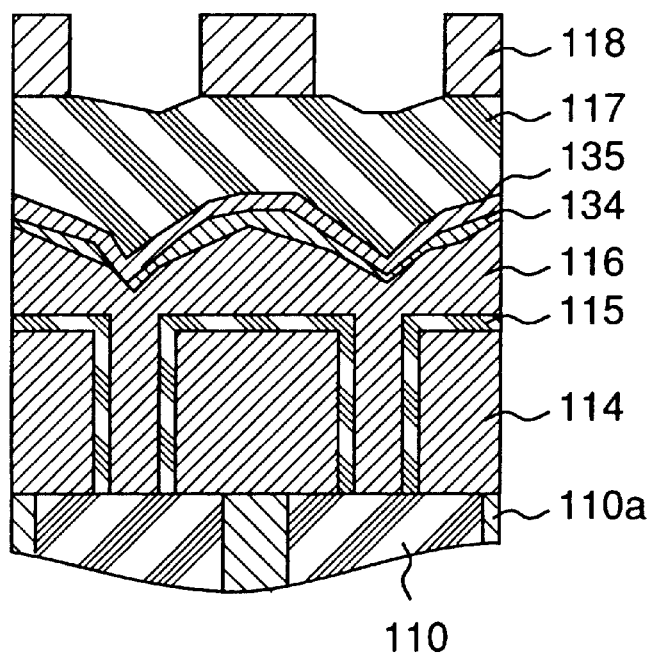
FIG. 10 is a cross sectional view showing another key portion of DRAM according to one embodiment of the present invention.

In the steps following the formation of the upper electrode 116, because the silicon oxide film 117 and the aluminum wiring layer 118 as the inter-layer insulation film make contact with the upper electrode 116, it is required to ensure close contact between these layers and chemical stability during subsequent steps For this purpose, it is effective to make a multi-layer structure having a thin titanium contact layer 134 of a thickness from 1 to 20 nm and a conductive metal nitride thin layer 135 as a diffusion-prevention layer as shown in FIG. 10. It is also effective to provide at least one of the contact layer 134 and the conductive diffusion-prevention layer 135.

The upper electrode 116 has a flat construction having relatively less steps because the film is formed to fill the steps, and therefore the contact layer 134 and the conductive diffusion-prevention layer 135 can be formed by the sputtering process, which is a proven technology in LSI wiring, thereby providing devices of high reliability.

Figure 11:
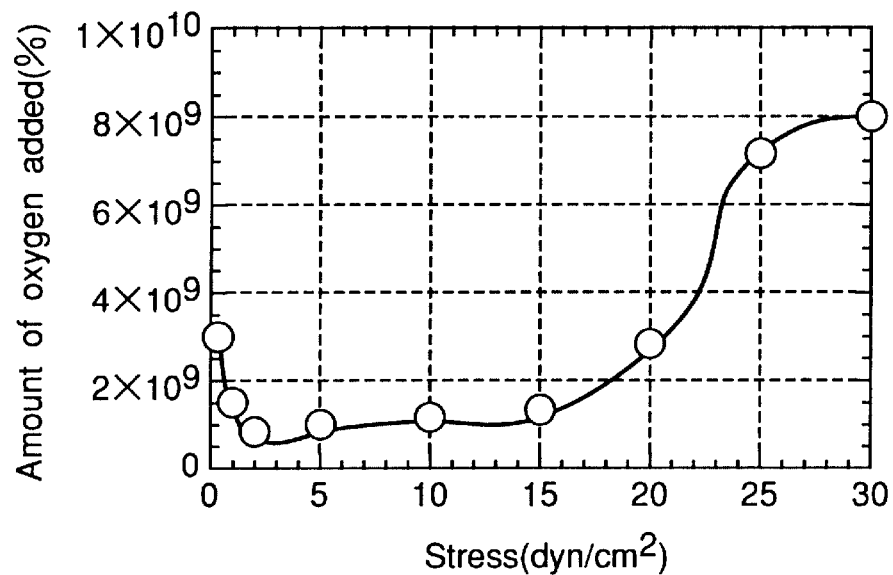
FIG. 11 is a drawing explaining the relationship between the amount of oxygen added and the film stress in the formation of metal ruthenium film in relation to one embodiment of the present invention.
Figure 12:
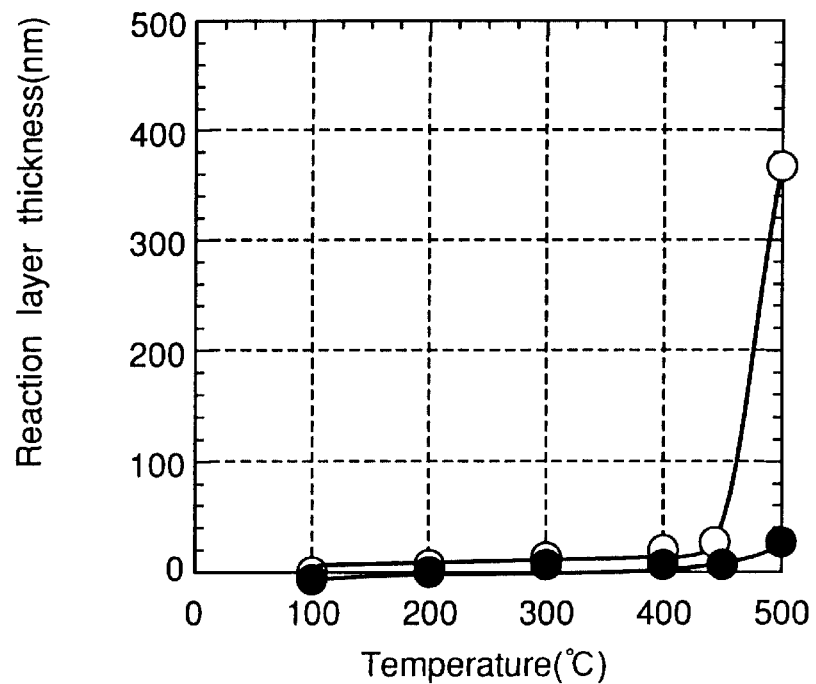
FIG. 12 is a drawing explaining the relationship between the temperature and the reaction layer thickness when the film of Al—Cu alloy is formed on the metal ruthenium layer is heated in nitrogen atmosphere in relation to one embodiment of the present invention.

When ruthenium is used as the upper electrode 116, it can be seen, from the results of experiments shown in FIG. 11 and FIG. 12, that film formation carried out in the presence of oxygen being added during filling leads to lower film stress, and a layer which includes relatively higher oxygen concentration being formed on the interface with the aluminum wiring layer 118 due to the diffusion of oxygen included in the film, thus having further effect of preventing the reaction with the aluminum wiring layer 118 and diffusion. FIG. 11 shows the relationship between the amount of oxygen added and the film stress in the formation of metal ruthenium, based on the result of an experiment conducted while changing the oxygen flow rate ratio without changing the pressure during sputtering under the standard conditions. Ruthenium film is 200 nm thick. Film stress suddenly increases when the amount of oxygen added increases beyond 20%, but decreases from 20 to 0.1% (1 to 0.01% in terms of oxygen concentration in the film). Thus controlling the oxygen concentration in the film within a range from 1 to 0.01% makes it possible to fill the step of microscopic slot shape and decrease the film stress. FIG. 12 shows the relationship between the temperature and the reaction layer thickness when a film of Al—Cu alloy which is commonly known as an LSI wiring material is formed in 400 nm thickness on metal ruthenium film of 200 nm thickness made by sputtering is heated in nitrogen atmosphere. Conditions of sputtering metal ruthenium were standard conditions in the case when oxygen was added, and were the same as the standard conditions except that the introduced gas was argon in the case when oxygen was not added. When oxygen was added (indicated by black circles in the drawing), the reaction temperature shifts toward high temperature side by 50 to 100° C. When heated at 450° C. without adding oxygen (indicated by white circles in the drawing), about 20 nm of reaction layer of Al—Cu alloy layer and ruthenium layer are observed, while it is not observed when oxygen is added, indicating that addition of oxygen is effective in preventing diffusion and reaction. While the experiments described above were conducted by using ruthenium, the same can be said when a metal including at least one element of ruthenium, iridium, platinum, palladium, rhodium and rhenium is used. Further, even when the conductive diffusion-prevention layer 135 is present, similar effect can be achieved because a layer having a relatively high oxygen concentration can be formed on the interface with the conductive diffusion-prevention layer 135 due to the diffusion of oxygen included in the film.

Figure 13:
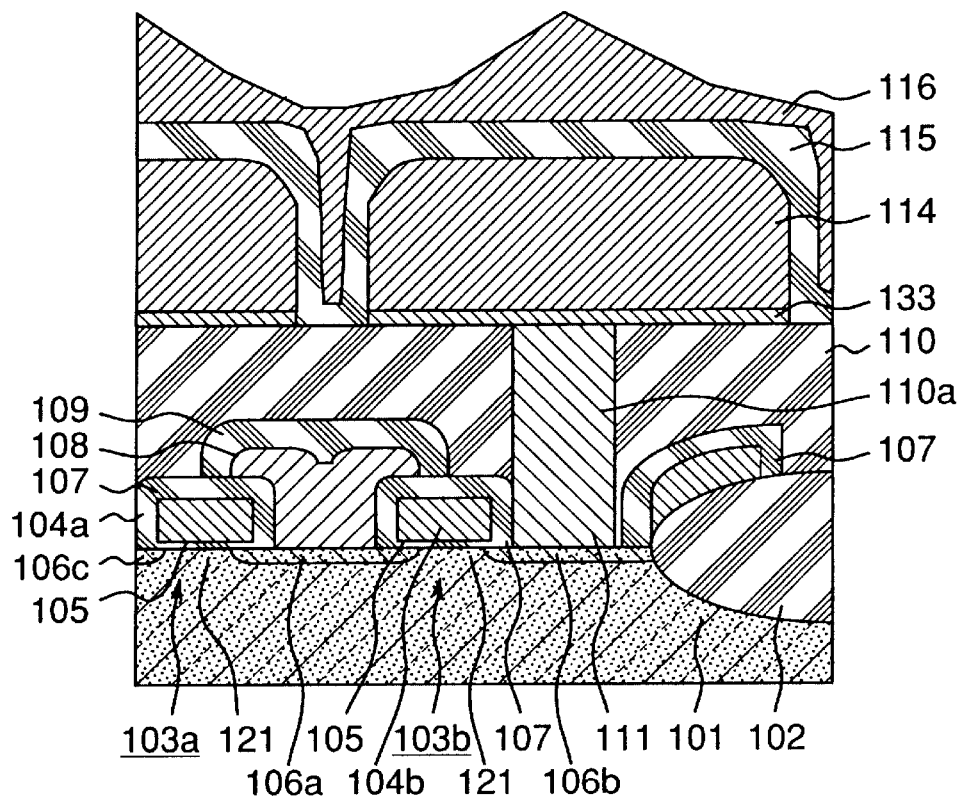
FIG. 13 is a cross sectional view showing another key portion of the DRAM according to one embodiment of the present invention.

It is desirable that the lower electrode 114 has such a configuration that the edges are square as shown in FIG. 3 through FIG. 7 in view of increasing the area which can be used as electrode, but curved configuration having rounded edges is effective as shown in FIG. 13 in improving the filing characteristic of the upper electrode 116. This configuration can be obtained by adding sputter etching with argon gas after ordinary processing during RIE (reactive ion etching) process of the lower electrode 114, for example (in sputter etching, corners are etched out preferentially as described previously) Thickness of the lower electrode 114 is preferably from 200 nm to 800 nm. By making edges in curved configuration, electric field concentration can be mitigated and leak current characteristic can be improved. When the edges are made in curved configuration having radius of curvature in a range from 0.05 to 0.8 µm, for example, leak current decreases to a range from 30 to 60 nA/cm$^2$ from 100 nA/cm$^2$ which is observed when±1V is applied.

Meanwhile sputter etching with argon has, in addition to the effect of rounding the corners, cleaning effect for a by-product (for example fluoride) generated during removing the silicon oxide film used as the etching mask, and makes it possible to improve the electric characteristics, such as improving the specific dielectric constant from 195 to 220 when CVD film of (Ba, Sr)TiO$_3$ is used as the capacitor insulation film. In case oxide of ruthenium or the like as the material to make the lower electrode 114 is obtained by sputtering film formation, similar film can be obtained by using an oxide target, not by the reactive sputtering process with an ordinary metal target, as described in relation with the upper electrode 116.

The producing method could be applied without any problem to cases of relatively wider and shallower steps where the separation width of the lower electrode 114 was 0.2 µm or greater or the ratio of separation width and height of the lower electrode 114 was 1 or less.

It needs not to say that the present invention is effective for devices other than DRAM having thin film capacitors which employ high dielectric constant film.

Embodiment 2

A second embodiment of the present invention will now be described below with reference to FIG. 14 through FIG. 20. FIG. 14 through FIG. 20 are partial sectional views sequentially showing the method for production of DRAM in the second embodiment of the present invention.

Figure 14:
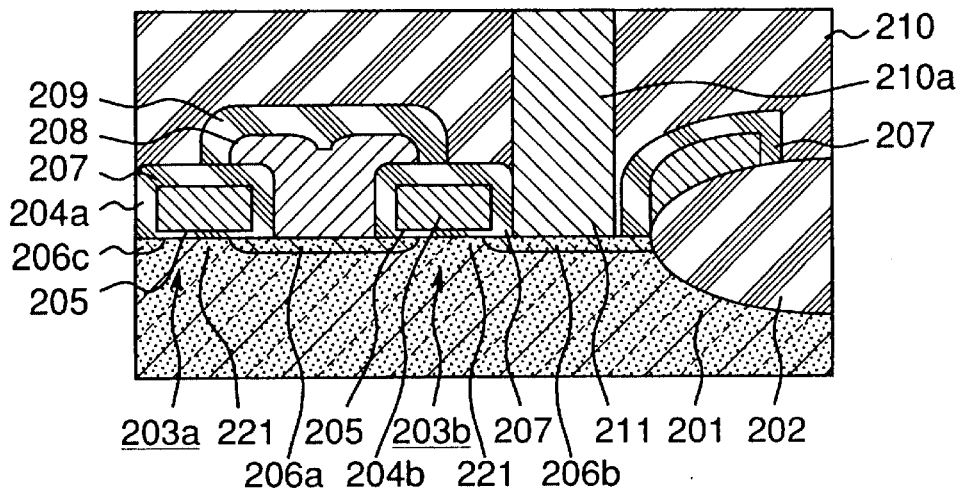
FIG. 14 is a partial cross sectional view explaining the first step of the method for production of DRAM according to the second embodiment of the present invention.

In the first step shown in FIG. 14, lower structure of a capacitor comprising a P type semiconductor substrate 201, a field oxide film 202, transfer gate transistors 203a, 203b, N type impurity regions 206a, 206b, 206c, a channel region 221, a gate insulation film 205, gate electrodes 204a, 204b, an oxide film 207, an embedded bit line 208, an insulation layer 209, a first inter-layer insulation film 210, a contact hole 210a, etc. is formed in methods similar to the prior art.

Then the contact hole 210a is filled by the CVD process employing SiH$_4$ gas and a polycrystalline silicon layer which is formed to cover the first inter-layer insulation film 210 and is doped with phosphorus is etched back by the RIE process or the like, thereby to form a plug 211 in the contact hole 210a. Although silicon is used as the material to make the plug 211 in this embodiment, metals such as tungsten, titanium and tantalum or alloys or nitride of these metals can also be used.

Figure 15:
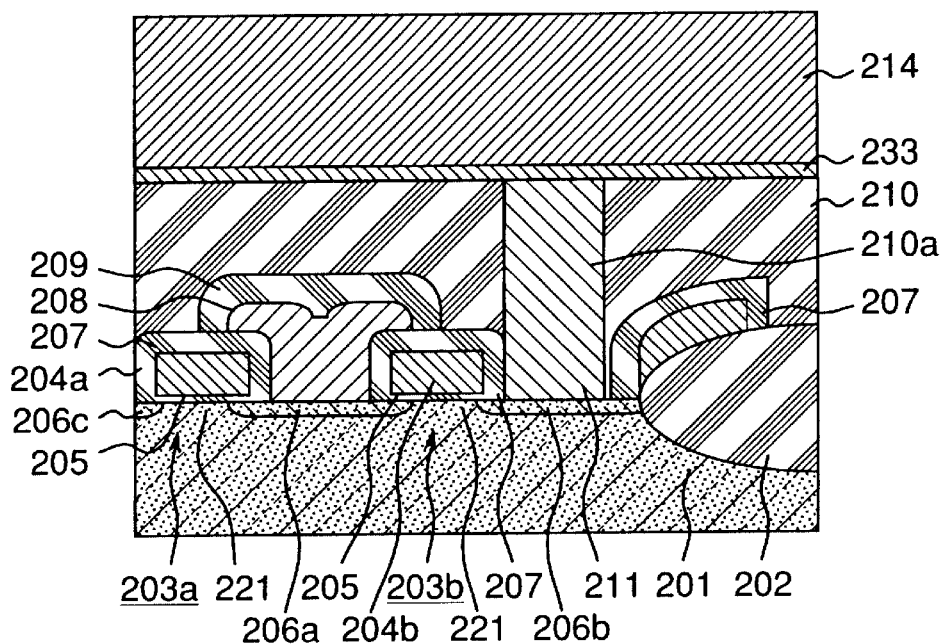
FIG. 15 is a partial cross sectional view explaining the second step of the method for production of DRAM according to the second embodiment of the present invention.

In the second step shown in FIG. 15, a capacitor lower electrode 214 is deposited on top face of the plug 211 and on the surface of the first inter-layer insulation film 210. In this embodiment, because polycrystalline silicon doped with phosphorus is used to make the plug 211, a conductive diffusion-prevention layer 233 made from titanium and a nitride thereof is formed between the capacitor lower electrode 214 and the plug 211 for the purpose of preventing the diffusion of silicon into the lower electrode 214. When diffusion does not make a problem, however, formation of the conductive diffusion-prevention layer 233 may be omitted in such a case as titanium nitride is chosen as the material for the plug 211. It has also been verified that contact resistance can be decreased by letting a part of the conductive diffusion-prevention layer 233 react with the plug 211.

The lower electrode 214 may be deposited by the CVD process or the sputtering process, by using such a metal as ruthenium, iridium, platinum, palladium, rhodium or rhenium, or a compound thereof as the material used in the process.

According to this embodiment, a ruthenium dioxide film having a thickness of 400 nm was formed as the lower electrode 214 by heating the semiconductor substrate 201 to 400° C. by the sputtering process.

While the semiconductor substrate may not necessarily be heated, in case it is heated, the temperature is preferably within 850° C.

Thickness of the lower electrode 214 is preferably such as the effect of making a recognizable level of practical increase in the capacitance, and within a range from 200 nm to 800 nm in consideration of the machining accuracy.

Figure 16:
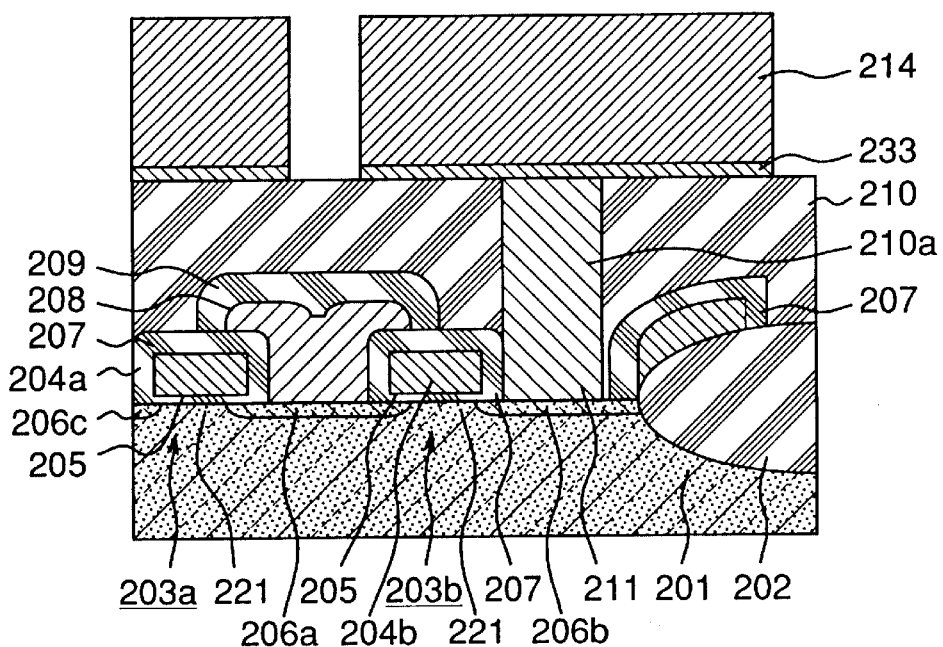
FIG. 16 is a partial cross sectional view explaining the third step of the method for production of DRAM according to the second embodiment of the present invention.

In the third step shown in FIG. 16, adjacent capacitor lower electrodes 214 are separated by a space of 0.2 µm by reactive ion etching. As the height of the lower electrode 214 is 400 nm, the ratio of height to separation width is 2.

Figure 17:
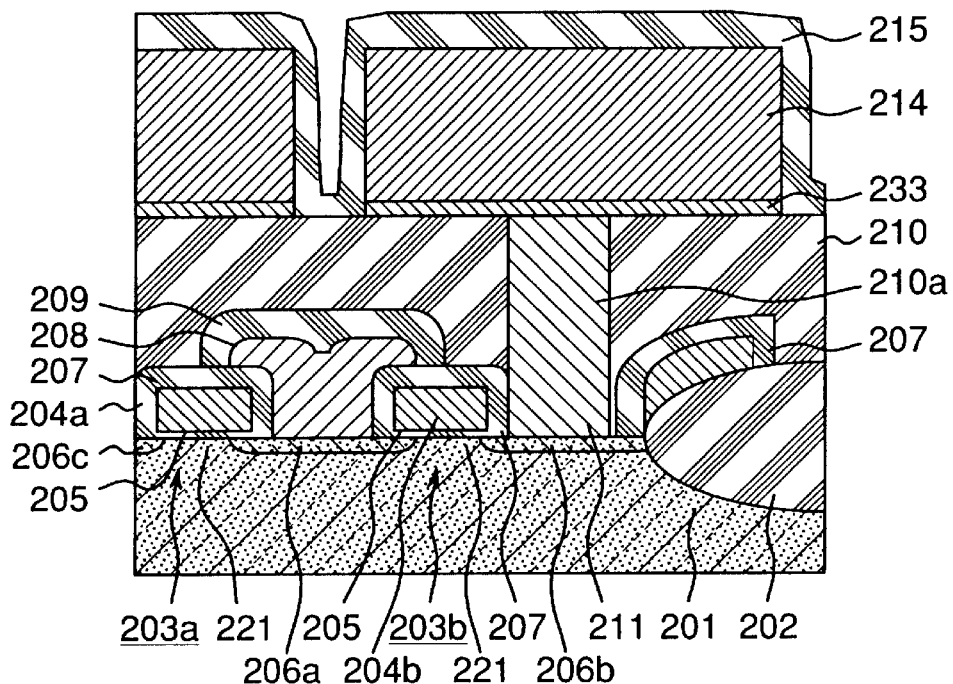
FIG. 17 is a partial cross sectional view explaining the fourth step of the method for production of DRAM according to the second embodiment of the present invention.

In the fourth step shown in FIG. 17, SrTiO$_3$ film is deposited to form the capacitor insulation film 215. In this embodiment, the CVD process is employed for forming the capacitor insulation film 215 in consideration of coverage of the side face of the lower electrode. Thickness of the film is 50 nm in this embodiment.

The step after forming the capacitor insulation film 215 becomes very narrow and deep, 0.1 µm in width and 0.4 µm in height thus having an aspect ratio of 4.

Figure 18:
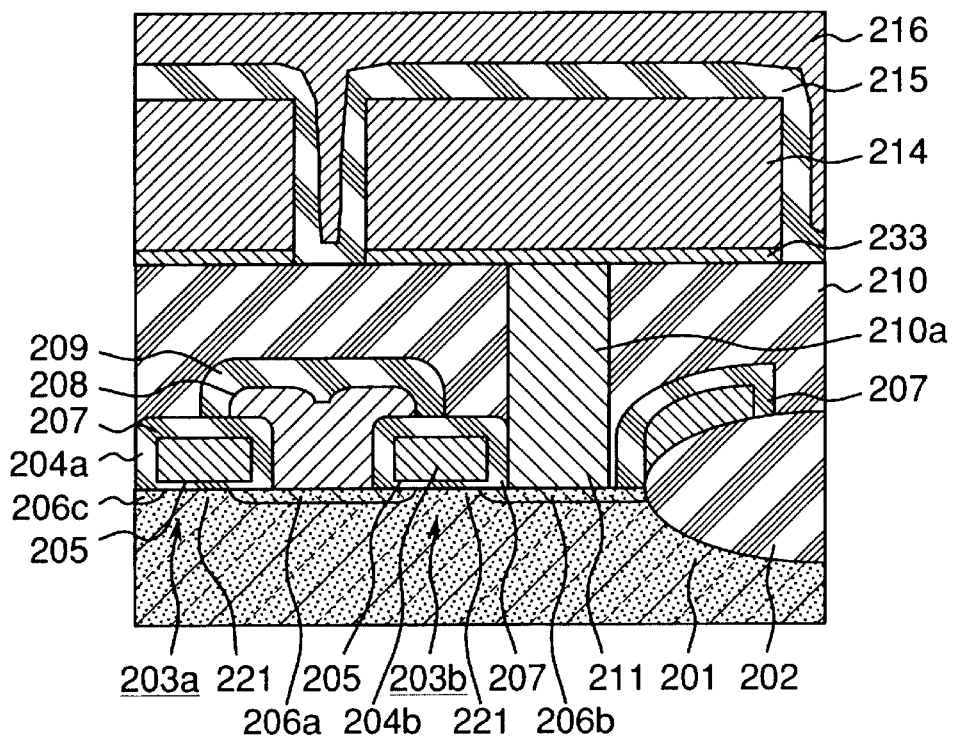
FIG. 18 is a partial cross sectional view explaining the fifth step of the method for production of DRAM according to the second embodiment of the present invention.
Figure 19:
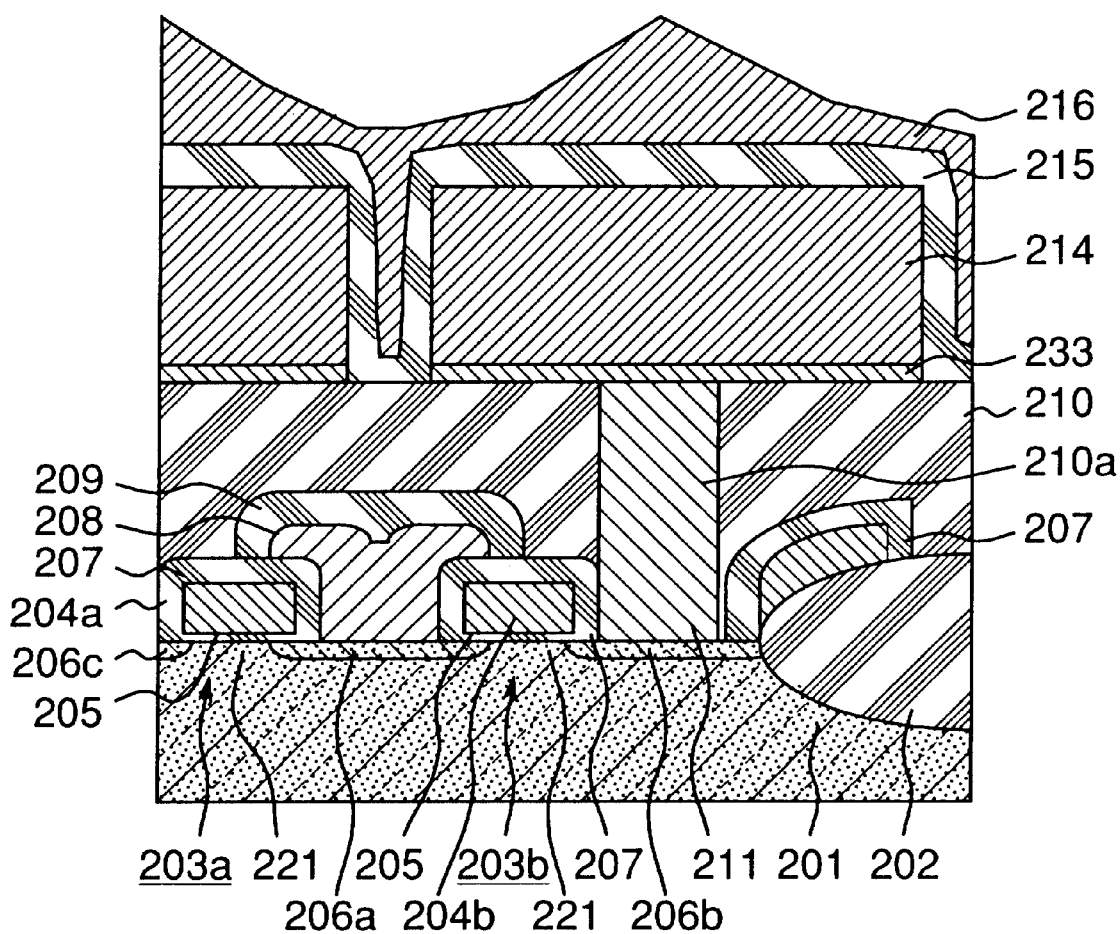
FIG. 19 is a partial cross sectional view explaining another example of the fifth step of the method for production of DRAM according to the second embodiment of the present invention.

In the fifth step shown in FIG. 18, the capacitor upper electrode 216 is formed to cover the capacitor insulation film 215 and fill the step.

A metal such as ruthenium, iridium, platinum, palladium, rhodium or rhenium, or a compound thereof is used to make the upper electrode 216 and, in this embodiment, ruthenium dioxide which is a compound of ruthenium is chosen to make the upper electrode 216. In this embodiment, ruthenium dioxide is deposited by reactive sputtering process wherein metal ruthenium is used as the target and argon and oxygen are used as major components of the sputtering gas. Sputtering conditions for forming the upper electrode 216 in this embodiment are gas pressure of 0.5 mTorr to 5 mTorr and the proportion of argon gas and oxygen gas is set to such a level as the ratio of film forming rate to etching rate is in a range from 2:1 to 5:1.

Oxygen has an effect of accelerating the generation of volatile ruthenium tetraoxide in plasma, and turns a part of ruthenium dioxide film which has been formed into ruthenium tetraoxide, thereby performing chemical etching effect. Because ruthenium tetraoxide which has been generated can easily decompose and deposit again as ruthenium dioxide, part of ruthenium dioxide film which is formed near the step acts to fill the step in the sputtering environment.

It was also clearly recognized that the ruthenium dioxide film which was formed was physically etched by argon, one of the major components of the sputtering gas, and by sputtered ruthenium atoms. In this case, ruthenium dioxide deposited near the step is sputtered again by the effect of sputter-etching, and fills the step.

In such a process where etching and film formation proceed at the same time, etched electrode material deposits again to fill the step, and therefore a very narrow step 0.1 µm in width and 0.4 µm in height, which would be very difficult to fill by the ordinary sputter film forming process, could be effectively filled.

Filling here refers to the formation of the capacitor upper electrode 216 surface at a position higher than at least the top surface of the capacitor lower electrode 214, and preferably at a position higher than the top surface of the capacitor insulation film 215. In this embodiment, surface of the capacitor upper electrode 216 is located at a position higher than the top surface of the capacitor insulation film 215.

Also according to this embodiment, because oxide of ruthenium is used for the capacitor upper electrode 216, insulation characteristic of the capacitor insulation film 215 does not deteriorate. Insulation characteristic of the capacitor insulation film 215 does not deteriorate provided that a metal including at least one of ruthenium, iridium, platinum, palladium, rhodium and rhenium, or a compound thereof is used to make at least one layer of the capacitor upper electrode 216.

After forming the upper electrode 216, patterning is performed to obtain the specified configuration.

Plasma CVD process can also be applied for forming the upper electrode 216. In the case of depositing ruthenium dioxode by CVD process, for example, deposition can be done at substrate temperature from 200° C. to 600° C. by using $Ru(C_5H_5)_2$, $Ru(DPM)_3$, $Ru_3(CO)_{12}$ or Ru(hfb) $(CO)_4$ as the material. DPM stands for dipivaloylmethanato, and hfb stands for hexafluoro-2-butyne.

In this embodiment, the upper electrode 216 made of ruthenium dioxide is formed by using $Ru(DPM)_3$ as the material gas. Film formation was carried out by plasma CVD process at a substrate temperature of 300° C. by introducing argon gas as a gas component which is capable of physically etching ruthenium, in addition to the material gas and oxygen which is a oxidizing gas.

As argon gas is added, part of ruthenium film is subject to physical etching by argon ions in the plasma CVD environment. In and around the step, physically etched ruthenium atoms tend to deposit again to fill the step, thus making it possible to effectively fill a very narrow step 0.1 μm in width and 0.4 μm in height, compared to the conventional plasma CVD process and thermal CVD process.

Argon gas supply is set so that the ratio of film forming rate to etching rate is in a range from 2:1 to 5:1.

Chemical etching effect is obtained by introducing oxygen gas or mixture gas prepared by adding chlorine gas to oxygen gas, making it possible to effectively filling the step through the generation, decomposition and re-deposition of ruthenium tetraoxide. Further, the ratio of film forming rate to etching rate can be controlled and the finished shape can be changed by adjusting the quantities of oxygen and chlorine gases to be added, providing an effect of making an better flattened shape. This makes the steps following the formation of the capacitor easier, and contributes to the product yield and device reliability.

In this case, too, a metal such as ruthenium, iridium, platinum, palladium, rhodium or rhenium, or a compound thereof can be used to make the upper electrode 216, and similar technique can be applied.

Figure 6:
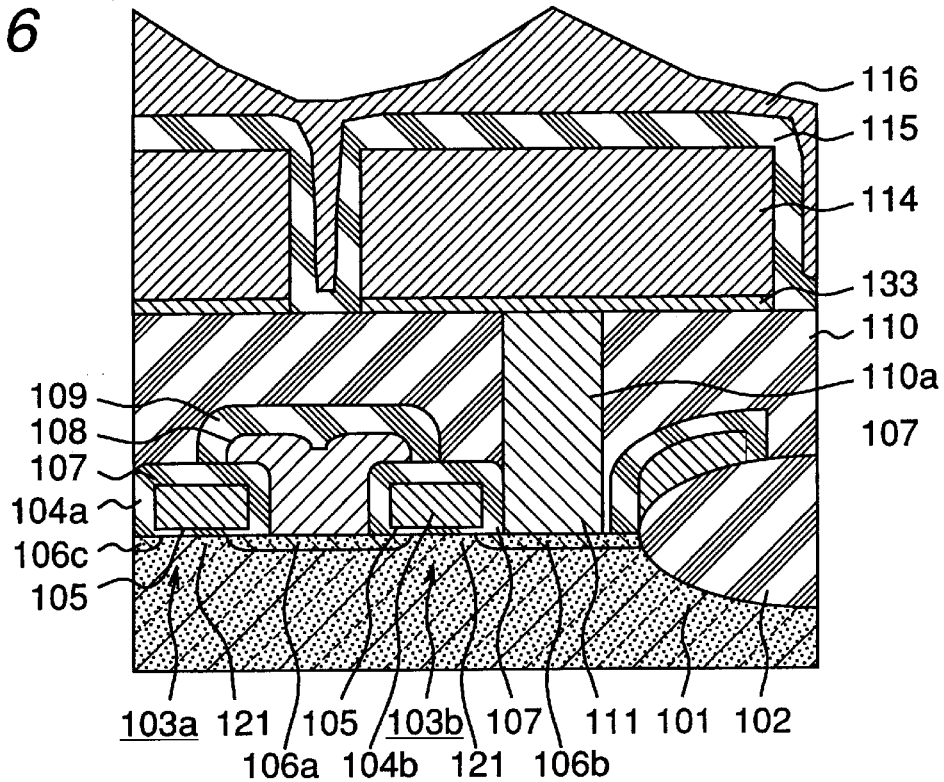
FIG. 6 is a cross sectional view explaining another example of the fifth process of the method for production of DRAM according to one embodiment of the present invention.

When filling a further smaller step during formation of the upper electrode 216 in the fifth step, the upper electrode 216 at a portion where the lower electrode 214 is formed may sometimes take a shape resembling a triangle after the upper electrode 216 is formed, as shown in FIG. 6. This shape was observed when $SrTiO_3$ film of 50 nm thick was deposited as the capacitor insulation film 215, in case the lower electrode 214 made of ruthenium was processed to become 400 nm in thickness and 0.15 μm in separation width, that is the ratio of height to separation width of the lower electrode 214 was about 2.6 in this embodiment. At this time, the step which had to be filled with the upper electrode 216 after forming the capacitor insulation film 215 was 0.05 μm wide and 0.4 μm high, with aspect ratio of the step being 8. The ratio of film forming rate to etching rate was in a range from 2:1 to 3:1.

While the triangular shape can be improved by increasing the proportion of the etching rate, basically there is no problem because the film covers the capacitor insulation film 216 and fills the step.

Flattening treatment can be applied when the shape is important. In this embodiment, chemical mechanical etching process was employed for flattening by using a slurry which shows acidity and includes aluminum oxide as a major component. Structure obtained after the flattening treatment is as shown in FIG. 18.

In this case, it is possible to make the steps following the formation of the capacitor upper electrode easier and further improve the yield and device reliability.

Figure 20:
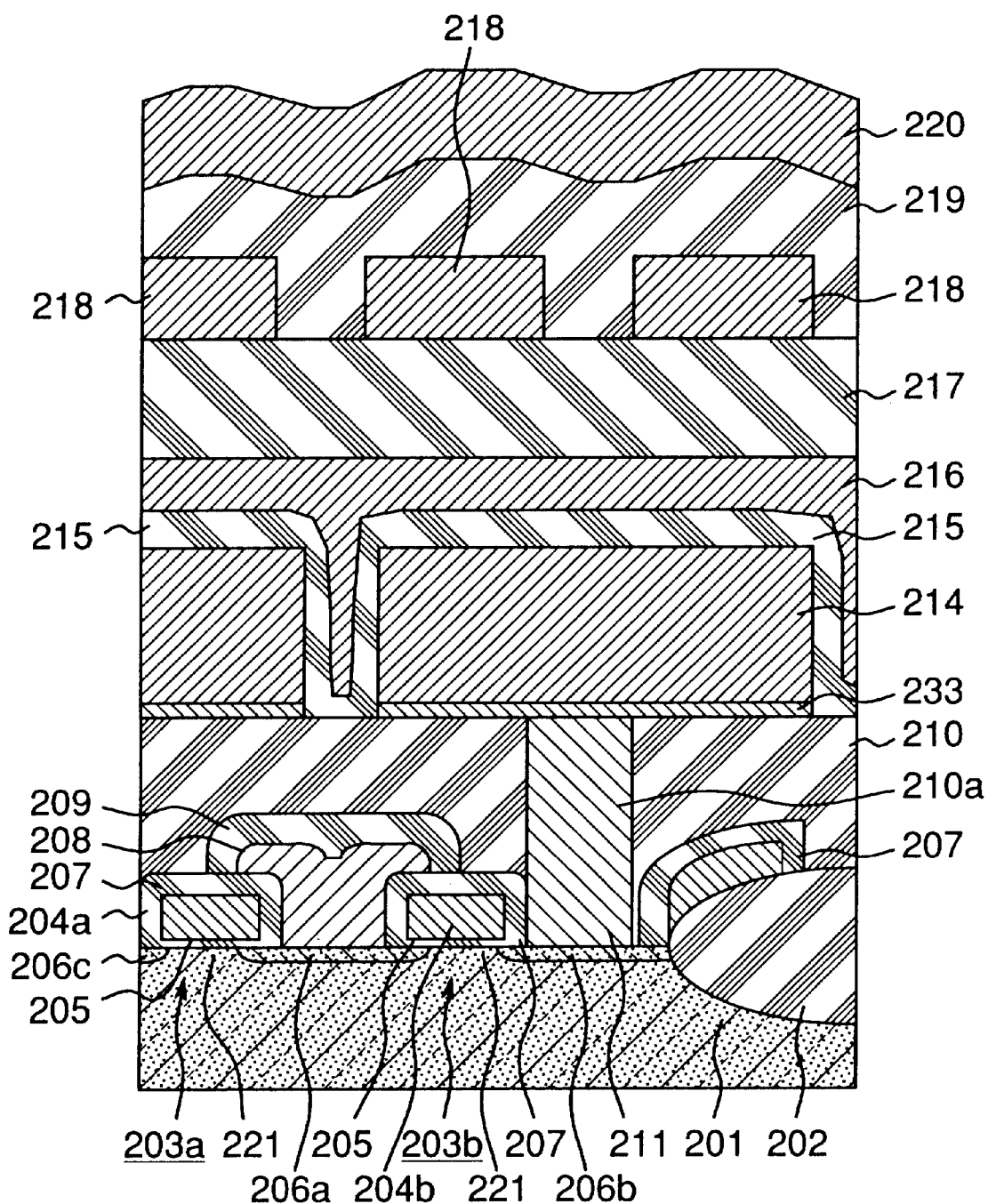
FIG. 20 is a partial cross sectional view showing the DRAM according to the second embodiment of the present invention.

In the sixth step shown in FIG. 20, a second inter-layer insulation film 217, a first aluminum wiring layer 218, a protective film 219, an aluminum wiring layer 220, etc. in the upper portion of the capacitor are formed in methods similar to those of the prior art, thereby to form the DRAM of one embodiment of the present invention.

In the device made as shown in FIG. 20, separation width between adjacent lower electrodes 214 is decreased to within 0.2 μm because of the large scale of integration and even when the area of the lower electrode 214 projected onto the principle plane is made as small as 0.15 square micrometers or smaller, for example, opposing area of the electrodes can be secured by increasing the height of the lower electrodes 214 to the separation width or greater, and therefore required amount of electric charge can be stored in the capacitor.

The producing method described above could be applied without any problem to cases of relatively wider and shallower steps where the separation width of the lower electrode 214 was 0.2 μm or greater or the ratio of separation width and height of the lower electrode 214 was 1 or less.

The present invention is effective for devices having thin film capacitors which employ high dielectric constant film other than DRAM.

What is claimed is:

1. A method for producing a semiconductor memory device comprising the steps of:

forming an inter-layer insulation film on a principal plane of a semiconductor substrate, the inter-layer insulation film having an aperture which reaches the principal plane of the semiconductor substrate;

embedding a connecting member in the aperture of the inter-layer insulation film;

forming a plurality of capacitor lower electrodes, arranged side by side and separated by slots, each capacitor lower electrode being electrically connected to the principal plane of the semiconductor substrate via a connecting member;

forming a capacitor insulation film from a material having a high dielectric constant to cover the plurality of capacitor lower electrodes while leaving a portion of each slot separating adjacent capacitor lower electrodes in the form of a step; and forming a capacitor upper electrode on the capacitor insulation film, wherein the capacitor upper electrode is formed in plasma which includes etchable gas to cover the capacitor insulation film and fill each step that results from said step of forming a capacitor insulation film.

2. A method for producing a semiconductor memory device according to claim 1, wherein adjacent capacitor lower electrodes are separated by a space of 0.2 μm or less, and a ratio of the height of a capacitor lower electrode to a separation width between adjacent capacitor lower electrodes is 1 or higher.

3. A method for producing a semiconductor memory device according to claim 1, wherein the capacitor upper electrode is formed by a plasma process using chemically or physically etchable gas.

4. A method for producing a semiconductor memory device according to claim 1, wherein the capacitor upper electrode has a layer formed from at least one element of ruthenium, iridium, platinum, palladium, rhodium and rhenium.

5. A method for producing a semiconductor memory device according to claim 1, wherein the capacitor upper electrode is formed by a sputtering process while using argon gas with oxygen gas added thereto.

6. A method for producing a semiconductor memory device according to claim 5, wherein oxide of a metal including at least one element of ruthenium, iridium, platinum, palladium, rhodium and rhenium is used as a sputtering target for the sputtering process.

7. A method for producing a semiconductor memory device according to claim 1, wherein the capacitor upper electrode is formed by a plasma CVD process in an oxidizing gas atmosphere with argon gas added thereto.

8. A method for producing a semiconductor memory device according to claim 1, wherein the capacitor upper electrode is formed by a sputtering process using a gas with halogen gas added.

9. A method for producing a semiconductor memory device according to claim 1, wherein the capacitor upper electrode is formed by a plasma CVD process in a reducing gas atmosphere with argon gas added thereto.

10. A method for producing a semiconductor memory device according to claim 1, wherein the capacitor upper electrode is formed by a plasma CVD process using a gas with Halogen gas added.

11. A method for producing a semiconductor memory device according to claim 1, wherein the capacitor lower electrode is made in a curved configuration.

12. A method for producing a semiconductor memory device according to claim 11, wherein the capacitor lower electrode has a radius of curvature in a range from 0.05 to 0.8 $\mu$m.

13. A method for producing a semiconductor memory device according to claim 1, wherein the capacitor lower electrode has an area projected onto a principal plane of the semiconductor substrate in a range from $1.5 \times 10^{-1}$ $\mu$m$^2$ to $9.8 \times 10^{-3}$ $\mu$m$^2$.

14. A method for producing a semiconductor memory device according to claim 1, wherein the capacitor upper electrode has a layer formed from a metal including 1 to 0.01% of oxygen and at least one element of ruthenium and iridium.

15. A method for producing a semiconductor memory device according to claim 1, wherein the capacitor lower electrode is made in a curved configuration by a sputter etching process using an inert gas after reactive ion etching process.

16. A method for producing a semiconductor memory device according to claim 15, wherein the corner of the capacitor lower electrode is etched during the sputter etching process.

* * * * *